(12) United States Patent
Novak et al.

(10) Patent No.: US 12,000,789 B2
(45) Date of Patent: Jun. 4, 2024

(54) METHOD AND SYSTEM FOR POSITIONING AND TRANSFERRING A SAMPLE

(71) Applicant: FEI Company, Hillsboro, OR (US)

(72) Inventors: Libor Novak, Brno (CZ); Krishna Kanth Neelisetty, Brno (CZ); Veronika Hammerova, Brno (CZ); Jan Lasko, Brno (CZ)

(73) Assignee: FEI Company, Hillsboro, OR (US)

( * ) Notice: Subject to any disclaimer, the term of this patent is extended or adjusted under 35 U.S.C. 154(b) by 125 days.

(21) Appl. No.: 17/561,497

(22) Filed: Dec. 23, 2021

(65) Prior Publication Data

US 2023/0204525 A1 Jun. 29, 2023

(51) Int. Cl.
  *G01N 23/2204* (2018.01)
  *G01N 23/2251* (2018.01)
  *G01N 23/2273* (2018.01)
  *H01J 37/20* (2006.01)

(52) U.S. Cl.
  CPC ..... *G01N 23/2204* (2013.01); *G01N 23/2251* (2013.01); *G01N 23/2273* (2013.01); *H01J 37/20* (2013.01)

(58) Field of Classification Search
  CPC ........... G01N 23/2204; G01N 23/2251; G01N 23/2273; G01N 2223/307; G01N 2223/304; G01N 2223/309; G01N 2223/321; G01N 2223/401; H01J 37/20; H01J 37/18; H01J 2237/2007; H01J 2237/2008; H01J 2237/202; H01J 2237/206; H01J 2237/2065
  USPC .................................................. 250/442.11
  See application file for complete search history.

(56) References Cited

U.S. PATENT DOCUMENTS

| | | | |
|---|---|---|---|
| 3,917,375 A | 11/1975 | Johnson | |
| 7,180,317 B2 | 2/2007 | Hollman | |
| 7,644,637 B2 | 1/2010 | Moore et al. | |
| 8,487,270 B2 | 7/2013 | Zeile et al. | |
| 9,064,672 B2 | 6/2015 | Mick et al. | |

(Continued)

FOREIGN PATENT DOCUMENTS

| | | |
|---|---|---|
| CZ | 33444 U1 | 12/2019 |
| DE | 4114427 C2 | 1/1995 |

(Continued)

OTHER PUBLICATIONS

Drouhin H-J., et al., "Ultrahigh Vacuum Sample Transfer Device with Broad Temperature Range," Review of Scientific Instruments, American Institute of Physics, Jun. 1, 1989, vol. 60, No. 6, XP000035889, pp. 1167-1168.

(Continued)

*Primary Examiner* — Kiet T Nguyen

(57) ABSTRACT

A system for positioning a sample in a charged particle apparatus (CPA) or an X-ray photoelectron spectroscopy (XPS) system includes a sample carrier coupled to a stage inside the vacuum chamber of the CPA or XPS system. The system allows transferring of the sample carrier among multiple CPAs, XPS systems and glove boxes in inert gas or in vacuum. The sample carrier is releasably coupled with the stage in the vacuum chamber of the CPA or the XPS. Multiple electrodes in a sample area of the sample carrier are electrically connectable with the stage by multiple spring contacts between the sample carrier and the stage.

21 Claims, 7 Drawing Sheets

(56) References Cited

U.S. PATENT DOCUMENTS

| | | | |
|---|---|---|---|
| 2012/0235036 A1* | 9/2012 | Hatakeyama | H01J 37/20 250/310 |
| 2019/0341223 A1 | 11/2019 | Berger et al. | |
| 2021/0350998 A1 | 11/2021 | Shukla | |

FOREIGN PATENT DOCUMENTS

| | | |
|---|---|---|
| JP | H02241024 A | 9/1990 |
| JP | 2004111097 A | 4/2004 |

OTHER PUBLICATIONS

EP23157978.0, Extended European Search Report, Oct. 20, 2023, 18 pages.
EP23157978.0, Partial European Search Report, Jun. 5, 2023, 11 pages.

* cited by examiner

METHOD AND SYSTEM FOR POSITIONING AND TRANSFERRING A SAMPLE

FIELD OF THE INVENTION

The present description relates generally to methods and systems for positioning a sample in a vacuum chamber of a charged particle apparatus (CPA) or an analyzer, as well as transferring the sample between tools including the CPA and the analyzer.

BACKGROUND OF THE INVENTION

Charged particle apparatus (CPA) and X-ray photoelectron spectroscopy (XPS) system can be used for imaging, processing, and analyzing microscopic objects. During a workflow involving the charged particle apparatus, a sample may be transferred among multiple tools for imaging, processing, manipulation, and/or storage. The sample may also be tested while the sample is positioned in the CPA or XPS system. For example, the sample holder for holding the sample may include multiple electrodes for biasing different portions of the sample. A compact and versatile sample positioning system is needed to facilitate the above-mentioned operations.

SUMMARY

In one embodiment, a system for sample positioning in a vacuum chamber of a charged particle apparatus (CPA) or an X-ray photoelectron spectroscopy (XPS) system comprises a sample carrier including multiple electrodes in a sample area; and a stage for moving the sample carrier within the vacuum chamber, wherein the sample carrier is releasably coupled to the stage by sliding the sample carrier along a rail of the stage, the stage electrically connectable with the multiple electrodes in the sample area via multiple spring contacts between the sample carrier and the stage.

In another embodiment, a method for analyzing a sample in a vacuum chamber of a CPA or an XPS system, comprises: loading the sample onto a sample carrier including multiple electrodes in a sample area; coupling the sample carrier to a stage in the vacuum chamber by sliding the sample carrier along a rail of the stage, the stage electrically connectable with the multiple electrodes in the sample area via multiple spring contacts between the sample carrier and the rail, and electrically biasing one or more of the multiple electrodes by sending electrical signals via the stage.

In another embodiment, a method for transferring a sample out of a vacuum chamber of a CPA or an XPS system comprises releasing a sample carrier from a stage within the vacuum chamber by sliding the sample carrier along a rail of the stage, wherein the sample carrier includes multiple electrodes in a sample area, the multiple electrodes electrically connectable with the stage via multiple spring contacts between the sample carrier and the rail; transferring the sample carrier into a sample transfer device; and detaching the sample transfer device from the CPA or the XPS system.

In this way, one or more samples held by a sample carrier may be transferred under vacuum or inert gas between tools. The sample carrier can be directly coupled to the stage in the CPA or the XPS system for sample imaging, processing, or analyzing. Further, electrical biases can be applied to the electrodes in the sample area via the stage when the sample is within the vacuum chamber.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
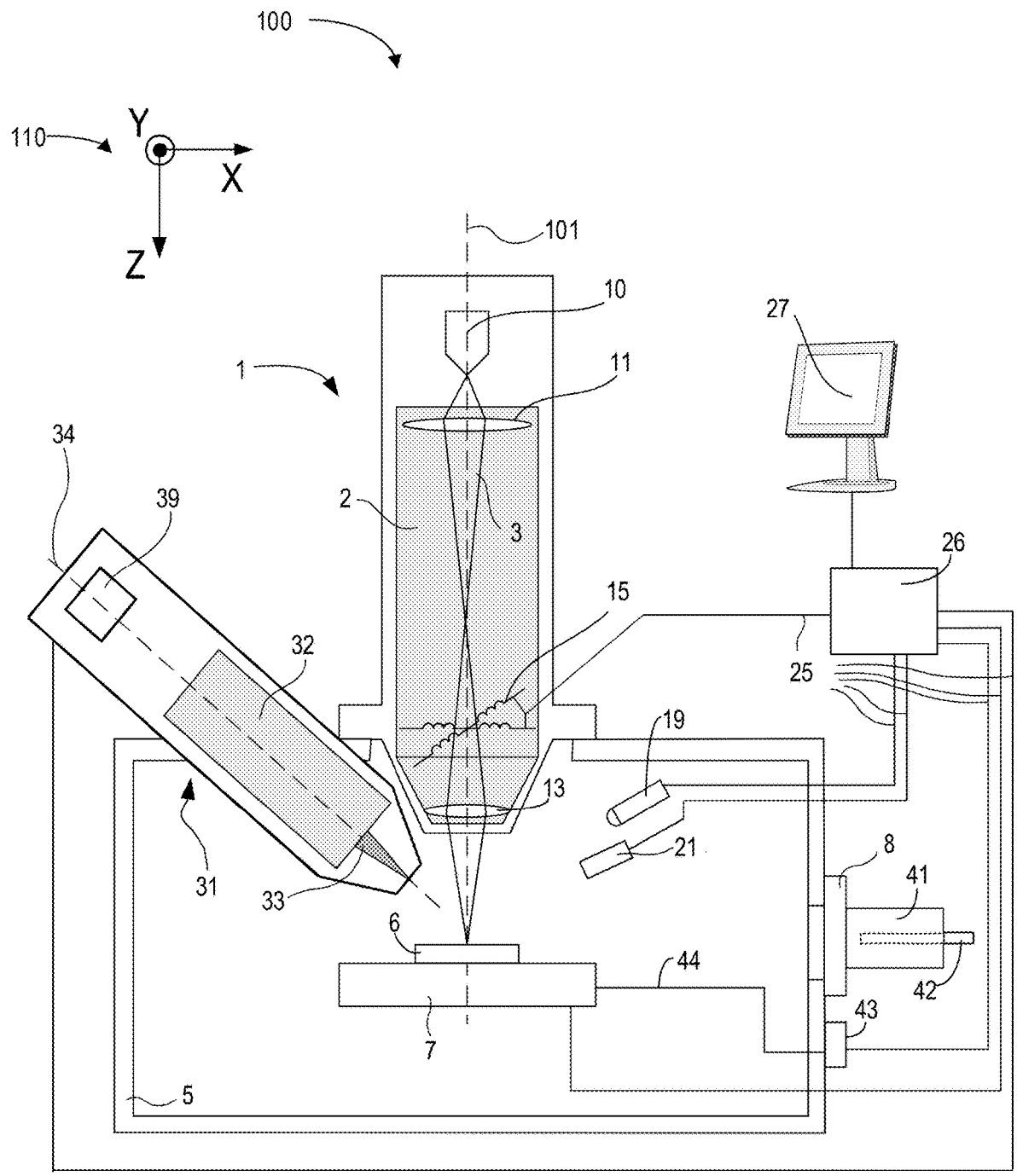
FIG. 1 is an example of a charged particle apparatus.

The following description relates to systems and methods for positioning and analyzing a sample in a vacuum chamber, such as the vacuum chamber of a charged particle apparatus (CPA) or an X-ray photoelectron spectroscopy (XPS) system using a sample positioning system. Further, methods for transferring a sample carrier among tools including the CPA and/or the XPS system are presented. The CPA may be a charged particle microscope, such as a dual-beam system shown in FIG. 1, or a sample processing apparatus, such as an ion beam processing system.

The CPA or the XPS system includes a stage in a vacuum chamber for positioning a sample relative to a charged particle beam or an X-ray beam. The sample may be held by a sample carrier. The stage may translate or rotate the sample carrier within the vacuum chamber. The sample carrier includes multiple electrodes in a sample area. The sample area may be formed by a microelectromechanical systems (MEMS) device. The multiple electrodes in the sample area are electrically connectable with the stage via multiple spring contacts positioned between the sample carrier and the stage. Each electrode may be individual biased by sending an electrical signal to the electrode via the stage. As such, one or more portions of the sample in the sample area may be tested. In one example, the sample may be a battery sample, wherein each electrode of the battery is in direct contact with one of the electrodes in the sample area. Electrical signals may be sent to and/or received from the battery sample positioned on the sample carrier via a connector external to the CPA or the XPS system. In another example, sample temperature may be increased by supplying current to the heating wire in the sample area. Because the electrical biasing may be applied to the sample while the sample is positioned inside the vacuum chamber, dynamic changes in the sample may be observed by imaging the sample using the charged particle beam (for example an electron beam). Further, the sample may be modified or processed in the CPA using a charged particle beam, such as the ion beam. For example, a battery sample may be formed by milling a bulk sample using the ion beam. The battery sample can be transferred to the sample area using a micromanipulator needle.

The sample carrier may be releasably coupled to the stage, for example, by sliding along a rail of the stage. The multiple spring contacts are positioned between the bottom end of the sample carrier and the bottom of the rail. The electrodes in the sample area are electrically connected with an electrical pad at the bottom of the sample carrier. After the sample carrier is slid into the rail and coupled to the stage, the electrical pad is in direct contact with the multiple spring contacts. Further, the spring contacts are compressed, and at least a side wall of the rail presses the sample carrier against the stage. As such, the multiple spring contacts not only function as electrical conductors, but also provide high mechanical rigidity to the sample positioning assembly to ensure sample positioning accuracy in the vacuum chamber. In some examples, the spring contact may be a leaf spring contact.

Figure 2A:
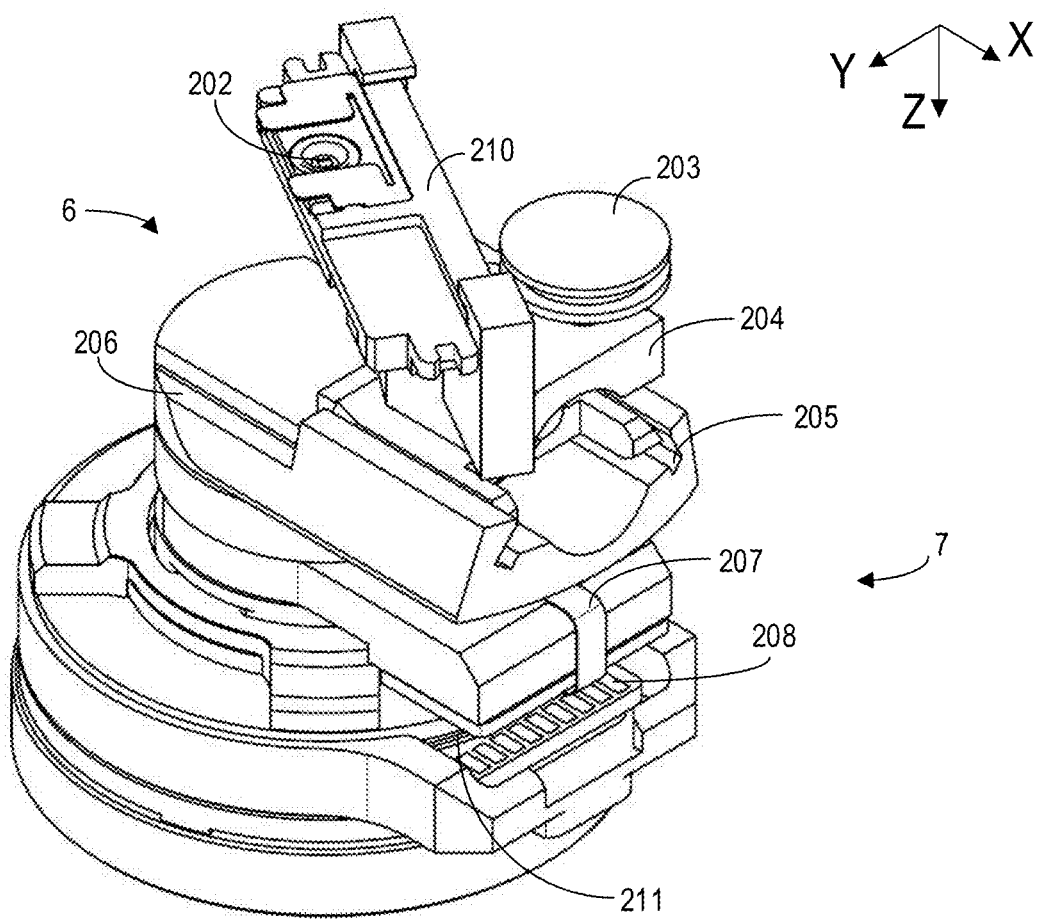
FIG. 2A shows a sample carrier coupled to a stage within a vacuum chamber.

In one example, as shown in FIG. 2A, the sample carrier includes a sample holder for holding the one or more samples and a shuttle. The sample holder may be an in-operando sample holder including a sample area with multiple electrodes. The sample holder may be transferred into or out of a vacuum chamber while being coupled with the shuttle. The shuttle may be releasably coupled to a stage in the vacuum chamber by sliding along a rail on an adaptor of the stage. Electrical connections are established between the electrodes in the sample area of the sample holder and the stage via the multiple spring contacts between the shuttle and the rail.

In one embodiment, the sample holder is releasably coupled to the shuttle. The shuttle may include one or more grooves for coupling the sample holder to the shuttle. Electrical connection between the sample holder and the shuttle may be established by multiple second spring contacts between the sample holder and the shuttle. For example, the sample holder includes a first electrical pad at the bottom of the sample holder. When the sample holder is coupled to the shuttle, the multiple second spring contacts at the top end of the shuttle are in direct contact with the first electrical pad. The second multiple spring contacts at the top end of the shuttle may be electrically connected to the electrical pad at the bottom of the shuttle via a flexible cable.

In another embodiment, the sample holder is permanently attached to the shuttle.

The sample carrier may be transferred between multiple tools including glove boxes, CPAs, and other analytical tools including the XPS system, using a sample transfer device. The sample transfer device may transfer the sample carrier under vacuum or inert gas environment. The sample carrier may be moved into or outside of the sample transfer device using a transfer rod of a sample transfer device, wherein one distal end of the transfer rod is mechanically coupled to the sample carrier. Further, the sample carrier may be coupled to or uncoupled from the stage by sliding the sample carrier along the rail of the stage using the transfer rod.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the detailed description is not to be taken in a limiting sense. Herein, the terms "top" and "bottom" refer to opposite directions along a primary axis of the charged particle or the analytical system (such as the Z-axis of the CPA). In one example, the term "top" refers a direction against the Z axis, and the term "bottom" refers to the direction along the Z axis.

Turning to FIG. 1, FIG. 1 shows an example of the CPA. FIG. 1 is a highly schematic depiction of an embodiment of a dual-beam charged particle microscope (CPM). Coordinate 110 is system coordinate. Microscope 100 comprises a particle-optical column 1, which produces a beam 3 of charged particles (in this case, an electron beam) that propagates along electron-optical axis 101. Electron-optical axis 101 may be aligned with the primary axis (i.e. Z-axis) of the system. The column 1 is mounted on a vacuum chamber 5, which comprises a stage 7 and associated actuators (not shown) for positioning a sample carrier 6 held by the stage. The sample carrier 6 may include a sample holder and a shuttle, wherein the sample holder holds one or more samples. The vacuum chamber 5 is evacuated using vacuum pumps (not depicted). Sample carrier may be introduced into or removed from the vacuum chamber via sample loader 8 on the wall of the vacuum chamber. A sample transfer device 41 is releasably coupled to the sample loader 8. The sample transfer device includes a transfer rod 42 to transfer the sample carrier into and/or out of the sample transfer device. Electrical signals may be sent to and/or received from the sample positioned on the sample carrier via connector 43 positioned external to the vacuum chamber 5. Connector 43 is electrically connected with sample held by the sample carrier via stage 7 and cable 44.

The electron column 1 comprises an electron source 10 and an illuminator 2. The illuminator 2 comprises lenses 11 and 13 to focus the electron beam 3 onto the sample, and a deflection unit 15 (to perform beam steering/scanning of the beam 3). The microscope 100 further comprises a controller/computer processing apparatus 26 for controlling inter alia the deflection unit 15, lenses 11, 13 and detectors 19, 21 and displaying information gathered from the detectors 19 and 21 on a display unit 27.

The detectors 19 and 21 may be chosen from a variety of possible detector types that can be used to examine different types of "stimulated" radiation emanating from the sample in response to irradiation by the (impinging) electron beam 3. It could alternatively be an X-ray detector, such as Silicon Drift Detector (SDD) or Silicon Lithium (Si(Li)) detector, for example. Detector 21 may be an electron detector in the form of a Solid State Photomultiplier (SSPM) or evacuated Photomultiplier Tube (PMT) for example. This can be used to detect backscattered and/or secondary electrons emanating from the sample. Microscope 100 may also include an ion detector and a mass analyzer for SIMS imaging. The skilled artisan will understand that many different types of detector can be chosen in a set-up such as that depicted, including, for example, an annular/segmented detector.

By scanning the beam 3 over the sample held by sample carrier 6, stimulated radiation—comprising, for example, X-rays, infrared/visible/ultraviolet light, secondary electrons (SEs) and/or backscattered electrons (BSEs)—emanates from the sample. Since such stimulated radiation is position-sensitive (due to said scanning motion), the information obtained from the detectors 19 and 21 will also be position-dependent.

The signals from the detectors pass along control lines (buses) 25, are processed by the controller 26, and displayed on display unit 27. Such processing may include operations such as combining, integrating, subtracting, false coloring, edge enhancing, and other processing known to the skilled artisan. Electrical signals from the sample may be transmitted to controller 26 along control lines 25. In some examples, electrical signals may be sent to the sample via a power supply connected to connector 43. The power supply may be controlled by controller 26. The controller may be programmed to automatically perform a diagnostic process on the sample. For example, the controller is programed to automatically run a battery cycling sequence and determine battery performance based on the received signals (such as signals received from connector 43). In addition, automated recognition processes (e.g. as used for particle analysis) may be included in such processing. The controller includes a non-transitory memory for storing computer readable instructions, and a processor for executing the computer readable instructions. Methods disclosed herein may be implemented by executing the computer readable instructions in the processor.

In addition to the electron column 1 described above, the microscope 100 also comprises an ion column 31. This comprises an ion source 39 and an illuminator 32, and these produce/direct a focused ion beam (FIB) 33 along an ion-optical axis 34. To facilitate easy access to sample, the ion-optical axis 34 is canted relative to the electron-optical axis 101. As hereabove described, such ion column 31 can, for example, be used to perform processing/machining operations on the sample, such as incising, milling, etching, depositing, etc. Additionally, the ion column 31 can be used to produce imagery of the sample. It should be noted that ion column 31 may be capable of generating various different species of ion; accordingly, references to ion beam 33 should not necessarily be seen as specifying a particular species in that beam at any given time—in other words, the ion beam 33 might comprise ion species A for operation A (such as milling) and ion species B for operation B (such as implanting), where species A and B can be selected from a variety of possible options.

The microscope may include a Gas Injection System (GIS), which can be used to effect localized injection of gases, such as etching or precursor gases, etc., for the purposes of performing gas-assisted etching or deposition. Such gases can be stored/buffered in a reservoir and can be administered through a narrow nozzle, so as to emerge in the vicinity of the intersection of axes 101 and 34, for example.

In another example, the CPM is a scanning electron microscope (SEM) that includes only the electron column.

FIG. 2A shows the sample carrier 6 and stage 7 in the vacuum chamber of a CPA, such as the microscope 100 of FIG. 1. The sample carrier includes sample holder 210 releasably coupled to shuttle 204. The sample holder 210 includes multiple electrodes in a sample area 202. The sample carrier 6 may hold bulk sample via bulk sample holder 203. The shuttle 204 may be coupled to adaptor 206 of stage 7 by sliding along rail 205. Rail 205 may be a dovetail groove. The adaptor 206 is electrically connected with soldering pad 208 via flexible cable 207 and rotating contact field 211. Electrical signals may be transferred into or out of the vacuum chamber by a cable connected to the soldering pads. For example, one distal end of the cable is connected to the soldering pad and the other distal end of the cable is external to the vacuum chamber (for example interconnected by an electrical feedthrough/connector 43 on the vacuum chamber 5). Electrical signals may transfer between the electrodes in the sample area and the distal end of cable that is outside of the vacuum chamber via the shuttle and the stage. The cable may be held by a cable holder. Samples held by the sample holder may be imaged, analyzed, or processed by a charged particle beam emitted from a polepiece. The sample carrier may be moved along any of the axes, as well as rotated around the Z axis by actuating stage 7. Electrical connection between the electrodes in the sample area 202 and the soldering pad 208 of the stage are maintained during stage maneuver.

Figure 2B:
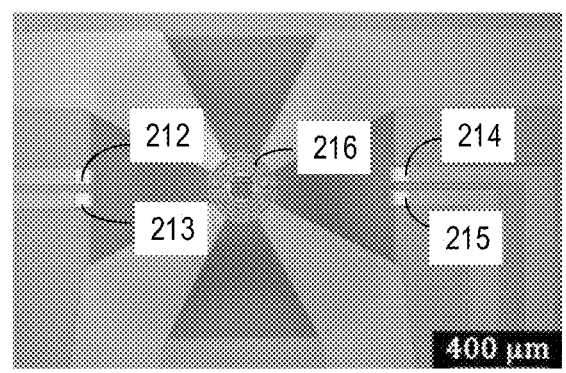
FIG. 2B shows a sample area of the sample carrier in one embodiment.

FIG. 2B shows an example sample area with multiple electrodes 212-215. The sample area may be a MEMS device. Electrical bias may be applied to a particular portion of the sample that is in direct contact with the electrode. The sample may also be heated by applying electrical signals to the heating circuit 216 in the sample area. In some examples, electrical signal (such as current or voltage) of the sample may be sensed/measured via the electrodes 212-215.

Figure 3:
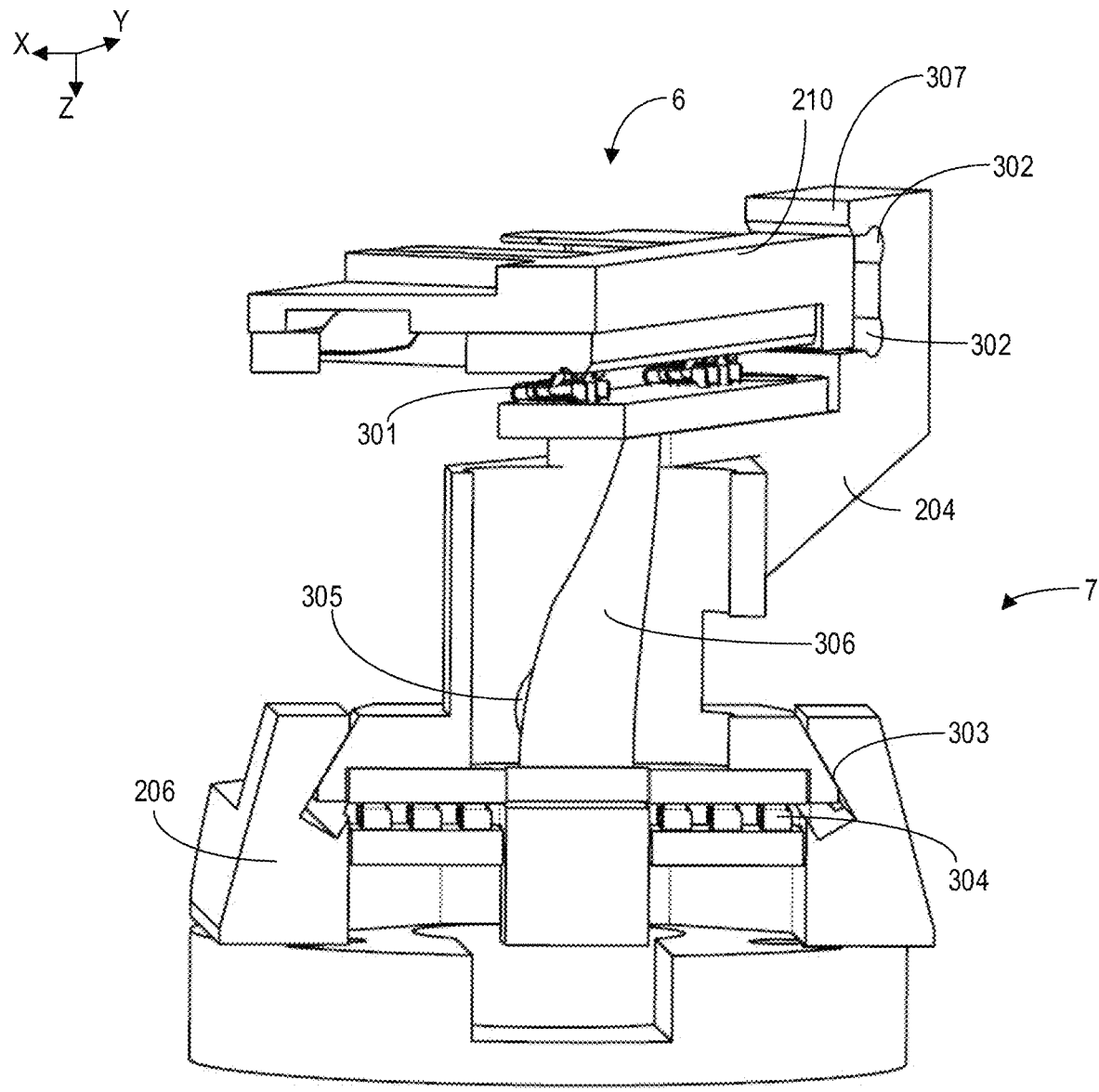
FIG. 3 is one cross-section of the sample carrier coupled to the stage.

FIG. 3 shows a cross-section of sample carrier 6 and stage 7 in the Y-Z plane. The sample holder 210 is releasably coupled to shuttle 204 by sliding along the grooves 302 of shuttle 204. The sample holder has a first electrical contact pad at the bottom (opposite to the top in the Z direction). The first electrical contact pad is electrically connected to the multiple electrodes in the sample area. When the sample holder is coupled to the shuttle, multiple spring contacts 301 fixed to the top end of the shuttle are compressed and in direct contact with the first electrical contact pad. Each electrode in the sample area of the sample holder may correspond to one spring contact. The movement of the sample holder along the Z-axis is confined by at least a side wall 307 of groove 302. The spring contacts 301 are electrically connected to a second contact pad at the bottom of shuttle 204 via flexible cable 306. Shuttle 204 includes receptacle 305 for receiving a distal end of the transfer rod. The transfer rod may be coupled to the shuttle by sliding the shuttle alone the rail in adaptor 206 of the stage. The rail may be a dovetail groove. When the shuttle is coupled to the adaptor, the second electrical contact pad at the bottom of shuttle 204 is in direct contact with multiple spring contacts 304 fixed to the bottom of the rail. The multiple spring contacts 304 are compressed by at least a side wall 303 of the rail. The side wall 303 is at an acute angle with respect to the bottom surface of the rail. The spring contacts of 301 and 304 act as electrical conductors to provide electrical connection between the sample holder and the shuttle, and between the shuttle and the stage, respectively. Further, the opposing force from the compressed spring contacts presses the sample holder or the shuttle against the corresponding at least a side wall of the groove or at least a side wall of the rail. Such configuration provides mechanical rigidity to the sample positioning system. In this way, any subtle stage maneuver can be accurately reflected as sample translation/rotation relative to the charged particle beam. The spring contacts (301 and 304) may be made from electrical conducting materials including one or more of brass, phosphor bronze, stainless steel, leaded nickel copper, and beryllium copper. The spring contacts may be plated by silver, gold, or platinum. Each of the spring contacts 304 may be larger than each of the spring contacts 301.

Figure 4:
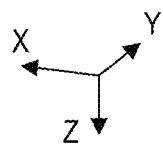
FIG. 4 is another cross-section of the sample carrier coupled to the stage.
Figure 4:
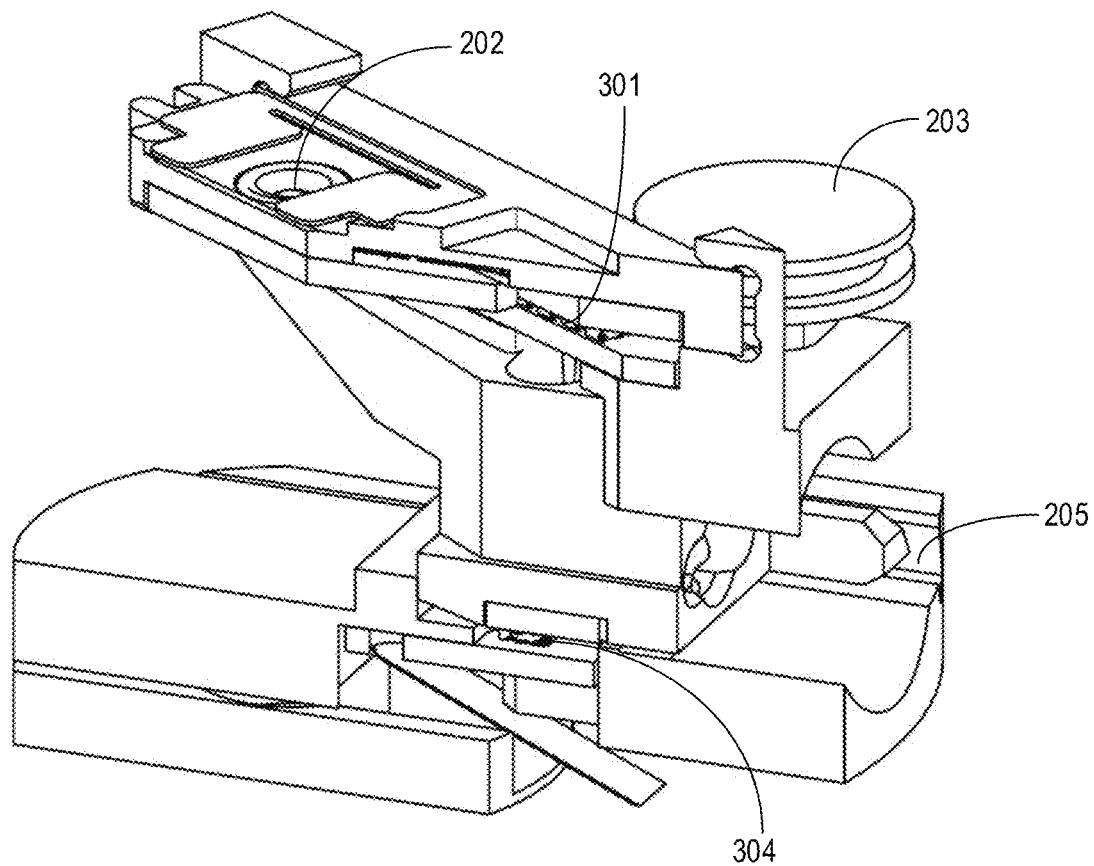

FIG. 4 shows an X-Z cross-section of the sample carrier and a part of the stage shown in FIG. 2A. The multiple electrodes in the sample area 202 are electrically connected to the electrodes of soldering pad 208 via the spring contacts 301 and spring contacts 304.

Figure 5:
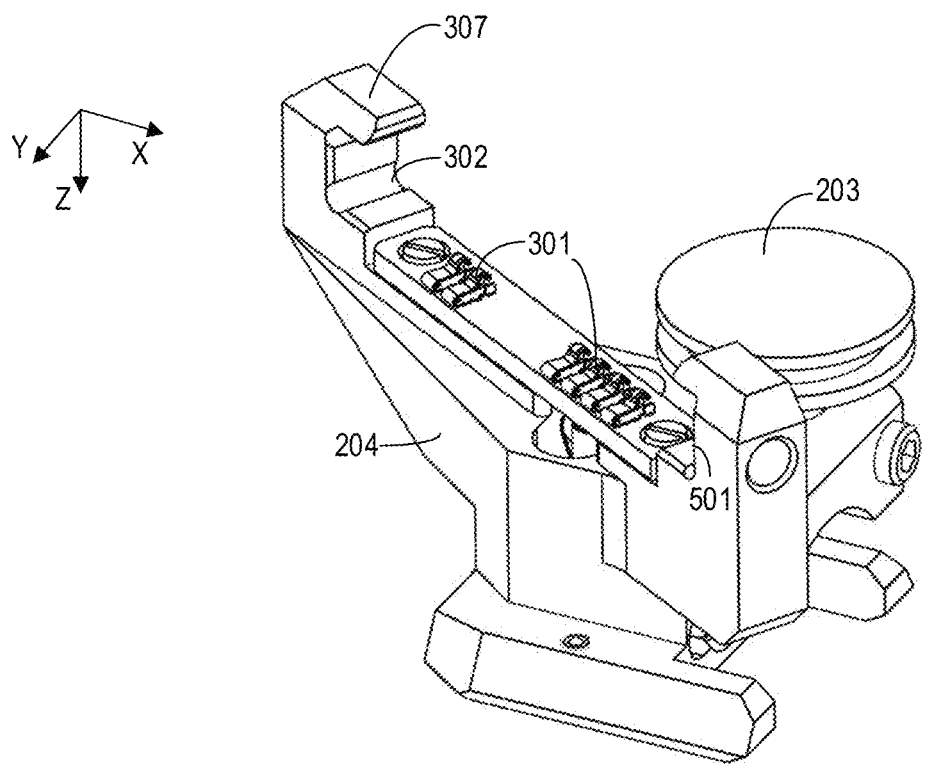
FIG. 5 is a first view of a shuttle of an example sample carrier.
Figure 6:
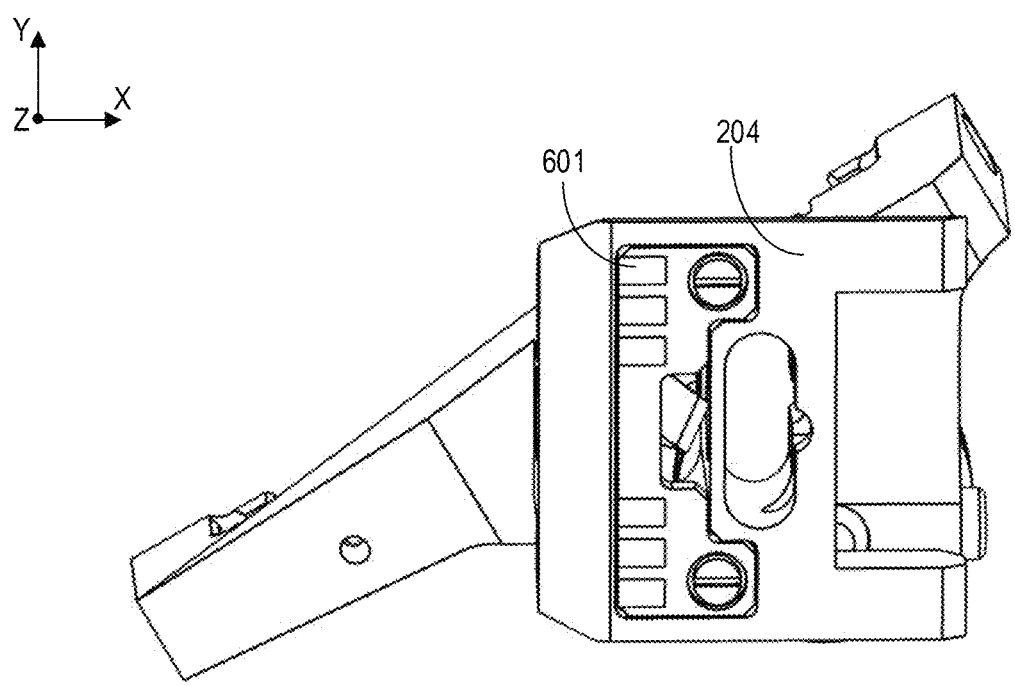
FIG. 6 is a second view of the shuttle.

FIG. 5 is a first, top, view of the shuttle 204, and FIG. 6 is a second, bottom, view of shuttle 204. The multiple spring contacts 301 fixed to the top end of shuttle 204 are electrically connected with the electrical pad 601 at the bottom end the shuttle. The shuttle may have the other groove 501 to hold the sample holder together with groove 302.

Figure 7:
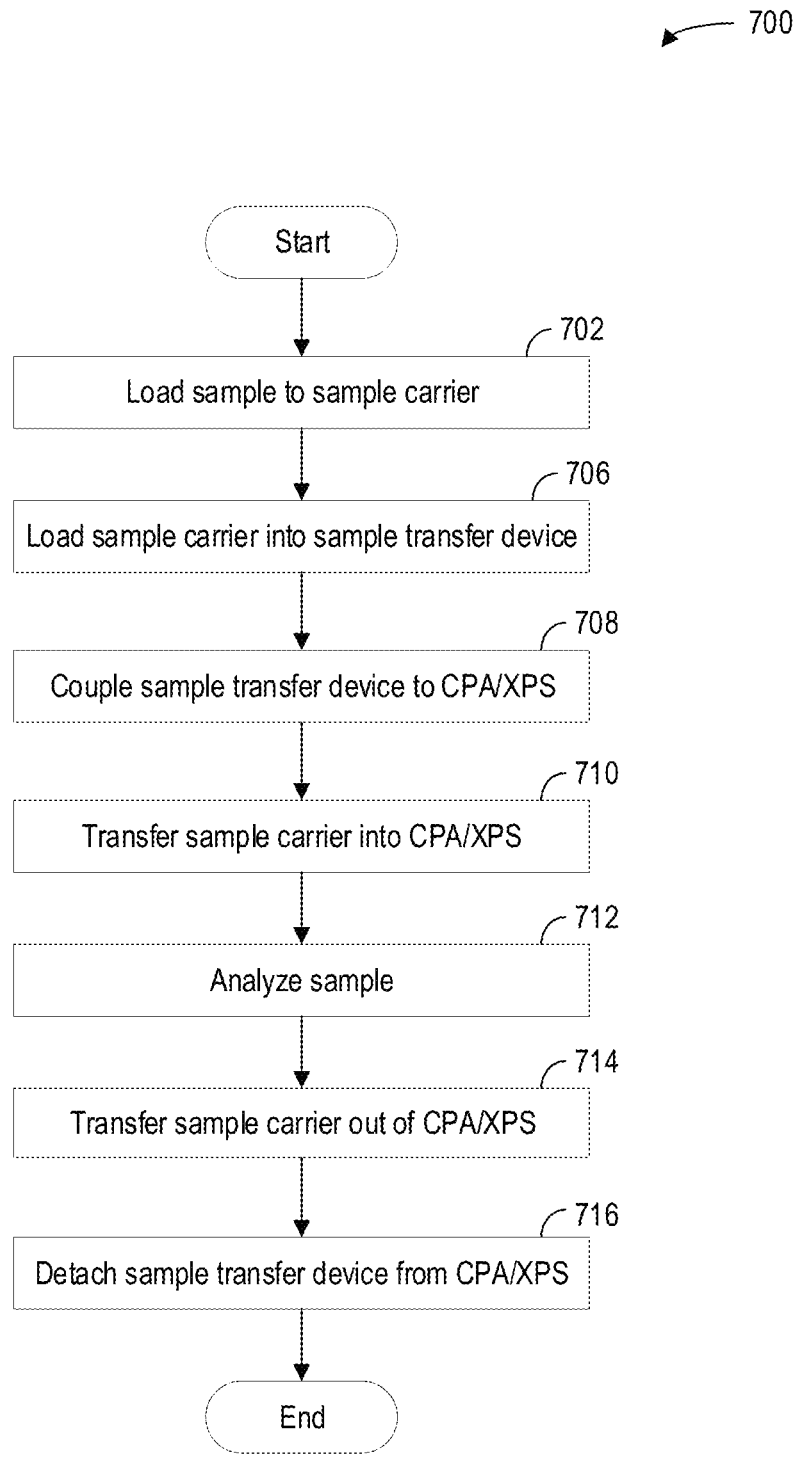
FIG. 7 is an example method for sample imaging, processing, or analyzing using a sample positioning system.

FIG. 7 shows method 700 for using the sample positioning system disclosed herein to transfer one or more samples between tools, as well as positioning the sample within the vacuum chamber for sample imaging, processing, or analyzing. The sample may be loaded onto the sample carrier in a glove box, then transferred to a CPA or an XPS system using a sample transfer device. In some examples, the sample may be first processed and subsequently imaged and tested within the CPA or the XPS system.

At 702, one or more samples are loaded onto the sample carrier. The samples may be loaded onto the sample carrier inside a glove box, under vacuum or inert gas environment. The samples may include micro-sample that is directly positioned in the sample area of the sample holder. The samples may also include bulk-sample that is positioned on the bulk sample holder (such as bulk sample holder 203 of FIG. 2) of the sample holder.

In some examples, the sample carrier includes a sample holder releasably coupled to a shuttle. Loading the samples to the sample carrier may include loading the sample onto the sample holder, and mechanically coupling the sample holder to the shuttle. The sample holder may be coupled with the shuttle inside the glove box, if the sample is air sensitive. The sample holder may be coupled to the shuttle by sliding the sample holder into the one or more grooves (such as groove 302 of FIG. 3) of the shuttle. The sample holder may be manually coupled to the shuttle.

At 706, the sample carrier is transferred into a sample transfer device. In one example, the sample transfer device is positioned inside the glove box. The sample carrier is transferred into the sample transfer device by operating a transfer rod of the sample transfer device. Specifically, a distal end of the transfer rod is extended outside a sample chamber of the sample transfer device and coupled with the sample carrier. In some examples, the distal end of the transfer rod is coupled with the shuttle of the sample carrier. The sample carrier is then pulled into the sample chamber of the sample transfer device using the transfer rod. The sample chamber may then be hermetically sealed under vacuum or inert gas. The sealed sample transfer device may be moved outside of the glove box. In some example, if the sample is not air sensitive, the sample carrier may be transferred into the sample transfer device in air.

At 708, the sample transfer device is coupled to a CPA/XPS system. The sample transfer device may be coupled to a sample loader on the external wall of the CPA/XPS system. Coupling the sample transfer device to the CPA/XPS system includes providing fluid connection between the vacuum chamber and the sample chamber of the sample transfer device. In one example, valves for sealing the sample chamber and the vacuum chamber may be opened to provide the fluid connection. In another example, if the sample chamber of the sample transfer device is sealed with inert gas at 706, the sample loader may first be filled with an inert gas before opening the valve for sealing the sample chamber. Vacuum may then be introduced to the sample chamber of the sample transfer device before opening the valve for sealing the vacuum chamber.

At 710, the sample carrier is transferred into the vacuum chamber. The sample carrier may be transferred into the vacuum chamber by extending the distal end of the transfer rod into the vacuum chamber. The sample carrier may be mechanically coupled to the stage inside the vacuum chamber. For example, the sample carrier is coupled to the stage by sliding the bottom end of the sample carrier along the rail (such as rail 205 of FIG. 2) of the stage. One or more samples may then be moved under the charged particle column by actuating the stage.

At 712, the samples held by the sample carrier may be imaged, processed, or analyzed in the CPA/XPS system. During the analysis, imaging or processing sessions, one or more electrodes in the sample area may be electrically biased by signals sent from external of the CPA/XPS system. The signals may travel from one end of a cable external to the CPA/XPS system to the electrodes in the sample area via the stage. For example, in the sample positioning system shown in FIG. 2A and FIG. 3, electrical signals may travel from the end of cable external to the vacuum chamber to the electrodes in the sample area sequentially via the feedthrough 43, the cable 44, soldering pad 208, flexible cable 207, spring contacts 304, and spring contacts 301. In one example, in a dual-beam system, a bulk sample held on the bulk sample holder may be used to manufacture a battery sample on the sample holder. Performance of the battery sample may be analyzed in-operando. Morphological changes of the electrodes (e.g. formation of dendrites) may be imaged in SEM during in-operando cycling (charging and discharging) of the battery.

At 714, the sample carrier is transferred into the sample transfer device from the vacuum chamber of the CPA/XPS system. The transfer rod may couple the sample carrier, then pull the sample carrier towards the sample transfer device to release the sample carrier from the rail. The sample or processed sample may then be sealed under vacuum or inert gas in the sample chamber of the sample transfer device. For example, the sample transfer device is filled with an inert gas after hermetically sealing the sample transfer device.

At 716, the sample transfer device is detached from the CPA/XPS system. The sample or processed sample may then be transferred to either another CPA/XPS system or the glove box without contacting air.

In this way, the air sensitive sample may be transferred, imaged, or processed on the in-operando holder in a workflow. The sample positioning system enables secure and easy sample transfer, as well as reliable performance of the CPA/XPS system.

Figure 8:
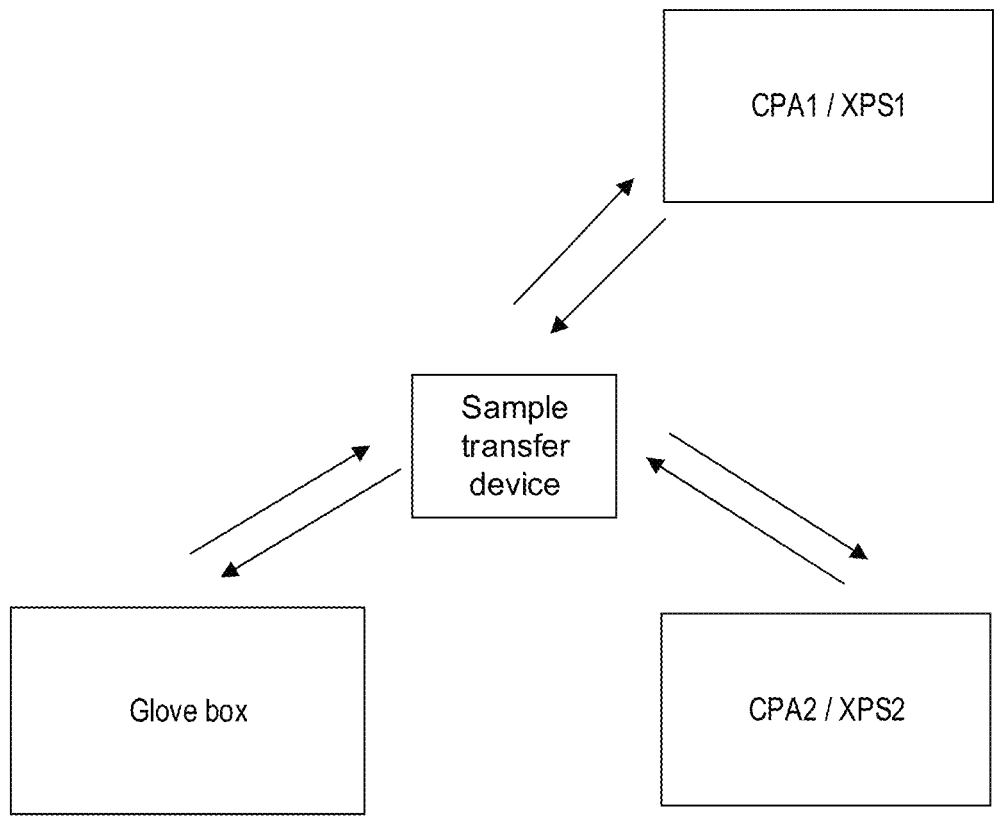
FIG. 8 shows example tools involved in the method of FIG. 7

FIG. 8 shows example tools involved in method 700 of FIG. 7. The sample, held by a sample carrier, can be transferred within the sample transfer device among glove box, multiple CPAs and analyzers (e.g. XPS).

The technical effect of a sample carrier releasably coupled to the stage in the vacuum chamber is to transfer the sample carrier into a sample transfer device. The sample carrier provides mechanical coupling to the sample transfer device. The technical effect of using the spring contacts between the sample carrier and the stage is to increase the rigidity of the mechanical coupling and at the same time provides electrical connection between the sample carrier and the stage.

In one embodiment, a system for sample positioning in a vacuum chamber of a charged particle apparatus (CPA) or an X-ray photoelectron spectroscopy (XPS) system, comprises a sample carrier including multiple electrodes in a sample area; and a stage for moving the sample carrier within the vacuum chamber, wherein the sample carrier is releasably coupled to the stage by sliding the sample carrier along a rail of the stage, the stage electrically connectable with the multiple electrodes in the sample area via multiple spring contacts between the sample carrier and the stage. In a first example of the system, the system further includes wherein the sample carrier includes a sample holder and a shuttle, and the sample holder is releasably coupled to the shuttle. A second example of the system optionally includes the first example and further includes wherein the sample holder further includes an electrical contact pad with multiple electrodes electrically connected with the multiple electrodes in the sample area, and the shuttle includes a top end with multiple spring contacts in direct contact with the electrical contact pad when the sample holder is coupled with the shuttle. A third example of the system optionally includes one or more of the first to the second examples, and further includes wherein the sample carrier further includes a receptacle for receiving a transfer rod for transferring the sample into a sealed sample transfer device. A fourth example of the system optionally includes one or more of the first to the third examples, and further includes wherein the sealed sample transfer device transfers the sample carrier among one or more of CPAs, XPS systems, and glove boxes. A fifth example of the system optionally includes one or more of the first to the fourth examples, and further includes wherein the sample is transferred under vacuum or inert gas in the sample transfer device among one or more of CPAs, XPS systems, and glove boxes. A sixth example of the system optionally includes one or more of the first to the fifth examples, and further includes wherein the rail includes at least a side wall at an acute angle with respect to a bottom of the rail. A seventh example of the system optionally includes one or more of the first to the sixth examples, and further includes wherein at least a side wall of the rail presses the sample carrier against the rail when the sample carrier is coupled to the stage. An eighth example of the system optionally includes one or more of the first to the seventh examples, and further includes wherein the rail is a dovetail groove. A ninth example of the system optionally includes one or more of the first to the eighth examples, and further includes wherein the multiple spring contacts are positioned between a bottom end of the sample carrier and a bottom of the rail. A tenth example of the system optionally includes one or more of the first to the ninth examples, and further includes wherein the stage is further electrically connected to a connector external to the CPA or XPS via a cable.

In another embodiment, a method for transferring a sample out of a vacuum chamber of a charged particle apparatus (CPA) or an X-ray photoelectron spectroscopy (XPS) system, comprises releasing a sample carrier from a stage within the vacuum chamber by sliding the sample carrier along a rail of the stage, wherein the sample carrier includes multiple electrodes in a sample area, the multiple electrodes electrically connectable with the stage via multiple spring contacts between the sample carrier and the rail; transferring the sample carrier into a sample transfer device; and detaching the sample transfer device from the CPA or the XPS system. In a first example of the method, the method further includes hermetically sealing the sample transfer device before detaching the sample transfer device from the CPA or XPS system. A second example of the method optionally includes the first example and further includes filling the sample transfer device with an inert gas before hermetically sealing the sample transfer device. A third example of the method optionally includes one or more of the first to the second examples, and further includes electrical biasing one or more of the multiple electrodes in the sample area while imaging or processing the one or more samples in the vacuum chamber. A fourth example of the method optionally includes one or more of the first to the third examples, and further includes wherein the multiple electrodes in the sample area are electrically connected with an electrical pad at a bottom surface of the sample carrier, and electrically connecting the multiple electrodes in the sample area and the stage includes directly contacting the electrical pad with the multiple spring contacts between the sample carrier and the rail.

In one embodiment, a method for analyzing a sample in a vacuum chamber of a charged particle apparatus (CPA) or an X-ray photoelectron spectroscopy (XPS) system, comprises loading the sample onto a sample carrier including multiple electrodes in a sample area; coupling the sample carrier to a stage in the vacuum chamber by sliding the sample carrier along a rail of the stage, the stage electrically connectable with the multiple electrodes in the sample area via multiple spring contacts between the sample carrier and the rail; and electrically biasing one or more of the multiple electrodes by sending electrical signals via the stage. In a first example of the method, the method further includes imaging, analyzing, or processing the sample while electrically biasing one or more of the multiple electrodes. A second example of the method optionally includes the first example and further includes wherein the electrical signals are sent from a connector outside of the vacuum chamber, and the method further comprising receiving electrical signals from the sample via the connector. A third example of the method optionally includes one or more of the first to the second examples, and further includes wherein the sample is loaded onto the sample carrier in a glove box, and the method further comprising transferring the sample carrier from the glove box to the vacuum chamber using a sample transfer device. A fourth example of the method optionally includes one or more of the first to the third examples, and further includes filling the sample transfer device with an inert gas before removing the sample transfer device from the glove box.

What is claimed is:

1. A system for sample positioning in a vacuum chamber of a charged particle apparatus (CPA) or an X-ray photoelectron spectroscopy (XPS) system, comprising:
   a sample carrier including multiple electrodes in a sample area; and
   a stage for moving the sample carrier within the vacuum chamber, wherein the sample carrier is releasably coupled to the stage by sliding the sample carrier along a rail of the stage, the stage electrically connectable with the multiple electrodes in the sample area via multiple spring contacts between the sample carrier and the stage.

2. The system of claim 1, wherein the sample carrier includes a sample holder and a shuttle, and the sample holder is releasably coupled to the shuttle.

3. The system of claim 2, wherein the sample holder further includes an electrical contact pad with multiple electrodes electrically connected with the multiple electrodes in the sample area, and the shuttle includes a top end with multiple spring contacts in direct contact with the electrical contact pad when the sample holder is coupled with the shuttle.

4. The system of claim 1, wherein the sample carrier further includes a receptacle for receiving a transfer rod for transferring the sample into a sealed sample transfer device.

5. The system of claim 4, wherein the sealed sample transfer device transfers the sample carrier among one or more of CPAs, XPS systems, and glove boxes.

6. The system of claim 5, wherein the sample is transferred under vacuum or inert gas in the sample transfer device among one or more of CPAs, XPS systems, and glove boxes.

7. The system of claim 1, wherein the rail includes at least a side wall at an acute angle with respect to a bottom of the rail.

8. The system of claim 1, wherein at least a side wall of the rail presses the sample carrier against the rail when the sample carrier is coupled to the stage.

9. The system of claim 1, wherein the rail is a dovetail groove.

10. The system of claim 1, wherein the multiple spring contacts are positioned between a bottom end of the sample carrier and a bottom of the rail.

11. The system of claim 1, wherein the stage is further electrically connected to a connector external to the CPA or XPS via a cable.

12. A method for transferring a sample out of a vacuum chamber of a charged particle apparatus (CPA) or an X-ray photoelectron spectroscopy (XPS) system, comprising:
    releasing a sample carrier from a stage within the vacuum chamber by sliding the sample carrier along a rail of the stage, wherein the sample carrier includes multiple electrodes in a sample area, the multiple electrodes electrically connectable with the stage via multiple spring contacts between the sample carrier and the rail;
    transferring the sample carrier into a sample transfer device; and
    detaching the sample transfer device from the CPA or the XPS system.

13. The method of claim 12, further comprising hermetically sealing the sample transfer device before detaching the sample transfer device from the CPA or XPS system.

14. The method of claim 13, further comprising filling the sample transfer device with an inert gas after hermetically sealing the sample transfer device.

15. The method of claim 12, further comprising electrical biasing one or more of the multiple electrodes in the sample area while imaging or processing the one or more samples in the vacuum chamber.

16. The method of claim 12, wherein the multiple electrodes in the sample area are electrically connected with an electrical pad at a bottom surface of the sample carrier, and electrically connecting the multiple electrodes in the sample area and the stage includes directly contacting the electrical pad with the multiple spring contacts between the sample carrier and the rail.

17. A method for analyzing a sample in a vacuum chamber of a charged particle apparatus (CPA) or an X-ray photoelectron spectroscopy (XPS) system, comprising:
    loading the sample onto a sample carrier including multiple electrodes in a sample area;
    coupling the sample carrier to a stage in the vacuum chamber by sliding the sample carrier along a rail of the stage, the stage electrically connectable with the multiple electrodes in the sample area via multiple spring contacts between the sample carrier and the rail; and
    electrically biasing one or more of the multiple electrodes by sending electrical signals via the stage.

18. The method of claim 17, further comprising imaging, analyzing, or processing the sample while electrically biasing one or more of the multiple electrodes.

19. The method of claim 17, wherein the electrical signals are sent from a connector outside of the vacuum chamber, and the method further comprising receiving electrical signals from the sample via the connector.

20. The method of claim 17, wherein the sample is loaded onto the sample carrier in a glove box, and the method further comprising transferring the sample carrier from the glove box to the vacuum chamber using a sample transfer device.

21. The method of claim 20, further comprising filling the sample transfer device with an inert gas before removing the sample transfer device from the glove box.

* * * * *